(12) United States Patent
Park et al.

(10) Patent No.: US 12,193,256 B2
(45) Date of Patent: Jan. 7, 2025

(54) DISPLAY APPARATUS

(71) Applicant: LG Display Co., Ltd., Seoul (KR)

(72) Inventors: Sangpil Park, Paju-si (KR); Jong-Moo Kim, Paju-si (KR); Seokwon Ji, Paju-si (KR); SangHoon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 513 days.

(21) Appl. No.: 17/558,574

(22) Filed: Dec. 21, 2021

(65) Prior Publication Data
US 2022/0209182 A1 Jun. 30, 2022

(30) Foreign Application Priority Data
Dec. 30, 2020 (KR) .................. 10-2020-0188186

(51) Int. Cl.
*H10K 50/844* (2023.01)
(52) U.S. Cl.
CPC .................. *H10K 50/844* (2023.02)
(58) Field of Classification Search
CPC .. H10K 50/844; H10K 59/8731; H10K 59/12; H10K 59/879; H10K 59/8791; H10K 2102/331; H10K 59/38
See application file for complete search history.

(56) References Cited

U.S. PATENT DOCUMENTS

| | | | | |
|---|---|---|---|---|
| 2012/0326194 | A1* | 12/2012 | Son | H10K 50/846 257/40 |
| 2014/0077187 | A1 | 3/2014 | Lee | |
| 2014/0326956 | A1* | 11/2014 | Wang | H10K 50/86 438/46 |
| 2017/0294565 | A1* | 10/2017 | Kim | H01L 33/405 |
| 2018/0026082 | A1 | 1/2018 | Lee et al. | |
| 2021/0391397 | A1* | 12/2021 | Koo | H10K 59/352 |

FOREIGN PATENT DOCUMENTS

| | | |
|---|---|---|
| KR | 10-2014-0038113 A | 3/2014 |
| KR | 10-2014-0131473 A | 11/2014 |
| KR | 10-2017-0116633 A | 10/2017 |
| KR | 10-2018-0009827 A | 1/2018 |

* cited by examiner

Primary Examiner — Yasser A Abdekaziez
(74) Attorney, Agent, or Firm — Morgan, Lewis & Bockius LLP

(57) ABSTRACT

A disclosed display apparatus may include a first electrode on a substrate, a light emitting layer on the first electrode, a second electrode on the light emitting layer, and an encapsulation layer covering the second electrode. The encapsulation layer may include a plurality of metal patterns spaced apart from one another.

16 Claims, 10 Drawing Sheets

DISPLAY APPARATUS

CROSS-REFERENCE TO RELATED APPLICATION

This application claims the benefit of and priority to Korean Patent Application No. 10-2020-0188186 filed on Dec. 30, 2020, which is hereby incorporated by reference as if fully set forth herein.

BACKGROUND

1. Technical Field

The present disclosure relates to a display apparatus.

2. Discussion of the Related Art

With the advancement of information-oriented society, various requirements for display devices for displaying an image are increasing. Therefore, various types of display devices, such as liquid crystal display (LCD) devices, plasma display panels (PDPs), and electroluminescent display devices, have been used recent years.

Electroluminescent display devices are self-emitting display devices and do not need a separate backlight. Therefore, compared to LCD devices, the electroluminescent display devices may be implemented to be lightweight and thin and to have lower power consumption. Also, the electroluminescent display devices may be driven with a direct current (DC) low voltage, may have a fast response time, and may have a lower manufacturing cost.

In a top emission type electroluminescent display apparatus of the related art where emitted light is irradiated upward, a structure with a polarization layer formed on a color filter is typically implemented. In such a structure, a total thickness of the electroluminescent display apparatus may increase due to the polarization layer, and the process cost may increase due to an additional process to form the polarization layer. Also, in a case where this related art structure of the electroluminescent display apparatus is applied to a rollable panel, rollable performance may be diminished due to an increased thickness of the panel.

Moreover, in a transparent display apparatus including an emission portion and a transmission portion, because the polarization layer cannot be selectively provided in regions excluding the transmission portion, a structure omitting the polarization layer should be implemented. In this case, however, there is a potential problem in that the reflection of external light caused by metal lines of light emitting elements and thin film transistors included in the emission portion may not be reduced.

SUMMARY

Accordingly, the present disclosure is directed to providing a display apparatus that substantially obviates one or more problems due to limitations and disadvantages of the related art.

An aspect of the present disclosure is directed to providing a display apparatus in which a polarization layer may be omitted, and the reflectivity of external light may be reduced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus may include: a first electrode on a substrate; a light emitting layer on the first electrode; a second electrode on the light emitting layer; and an encapsulation layer covering the second electrode, the encapsulation layer including a plurality of metal patterns spaced apart from one another.

In some example embodiments, the encapsulation layer may further include a first organic layer and a second organic layer overlapping each other, wherein the metal patterns may be disposed between the first organic layer and the second organic layer to be disposed within the encapsulation layer.

In some example embodiments, the encapsulation layer may comprise a first encapsulation layer on the second electrode; a second encapsulation layer on the first encapsulation layer and including the first organic layer, the second organic layer, and the metal patterns; and a third encapsulation layer on the second encapsulation layer.

In some example embodiments, the first organic layer may include a plurality of protrusion portions spaced apart from one another. A second organic layer may include a flat surface facing away from the first organic layer. Each of the metal patterns may be provided on a sidewall of a corresponding one of the protrusion portions.

In some example embodiments, the protrusion portions may protrude in a vertical direction on a plane of the first organic layer having a thickness, may be arranged in one row at a predetermined interval in a first direction, and may have a rectilinear shape extending in a second direction perpendicular to the first direction.

In some example embodiments, the predetermined interval may be less than or equal to 400 nm.

In some example embodiments, the metal patterns may be thicker toward upper end portions of the protrusion portions than toward lower end portions of the protrusion portions.

In some example embodiments, a width of each of the protrusion portions may decrease from a lower portion thereof to an upper portion thereof.

In some example embodiments, an upper end portion of each of the protrusion portions may include a flat region, and each of the metal patterns may partially cover the upper end portion of the corresponding one of the protrusion portions.

In some example embodiments, the sidewall of each of the protrusion portions may be flat.

In some example embodiments, each of the metal patterns may cover a portion of a left sidewall and a portion of a right sidewall of the corresponding one of the protrusion portions.

In some example embodiments, a height of each of the protrusion portions may be greater than or equal to 50 nm and less than or equal to 200 nm.

In some example embodiments, the metal patterns may be arranged at an interval of 400 nm or smaller.

In some example embodiments, the substrate may include an emission area, a transmission area, and a non-display area. The first electrode may be provided in the emission area. The light emitting layer and the second electrode may be provided in the emission area and the transmission area. The encapsulation layer may cover the second electrode in the emission area and the transmission area and may include the plurality of metal patterns in the emission area.

In another aspect of the present disclosure, a display apparatus may include: a substrate including an emission area, a transmission area, and a non-display area; a first electrode on the substrate in the emission area; a light emitting layer on the first electrode; a second electrode on the light emitting layer; and an encapsulation layer covering the second electrode in the emission area and the transmission area, the encapsulation layer including a plurality of metal patterns spaced apart from one another in the emission area.

In some example embodiments, the encapsulation layer further may further include: a first organic layer; and a second organic layer between the first organic layer and the second electrode, wherein the metal patterns may be disposed between the first organic layer and the second organic layer to be disposed within the encapsulation layer.

In some example embodiments, the first organic layer may comprise a plurality of protrusion portions in the emission area and a flat bottom surface in the transmission area. The protrusion portions may be spaced apart from one another. Each of the metal patterns may be on a sidewall of a corresponding one of the protrusion portions.

In some example embodiments, the protrusion portions may protrude in a vertical direction on a plane of the first organic layer having a thickness, may be arranged in one row at a predetermined interval in a first direction, and may have a rectilinear shape extending in a second direction perpendicular to the first direction.

In some example embodiments, the metal patterns may be thicker toward lower end portions of the protrusion portions than toward upper end portions of the protrusion portions. A width of each of the protrusion portions may decrease from an upper portion thereof to a lower portion thereof.

In some example embodiments, a lower end portion of each of the protrusion portions may include a flat region, and each of the metal patterns may partially cover the lower end portion of the corresponding one of the protrusion portions.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
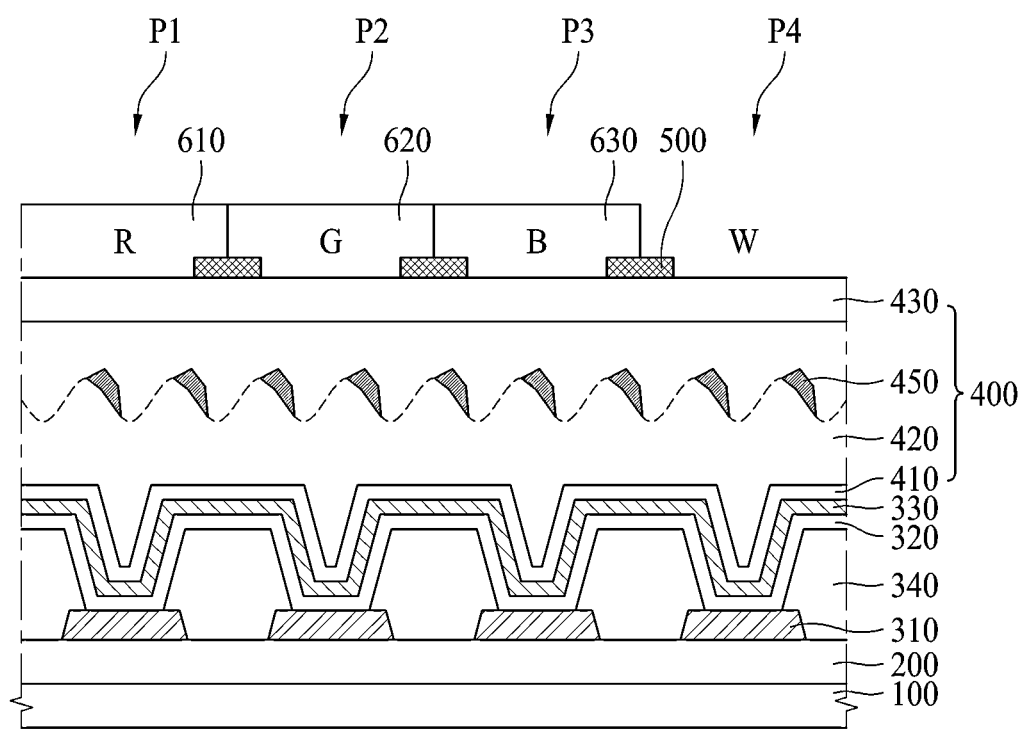
FIG. 1 is a schematic cross-sectional view of a display apparatus according to a first example embodiment of the present disclosure.

Reference will now be made in detail to various embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, example embodiments of the present disclosure will be described in detail with reference to the accompanying drawings.

First Example Embodiment

FIG. 1 is a schematic cross-sectional view of a display apparatus according to a first example embodiment of the present disclosure.

As illustrated in FIG. 1, the display apparatus according to the first example embodiment of the present disclosure may include a first substrate 100, a circuit element layer 200, a first electrode 310, a light emitting layer 320, a second electrode 330, a bank 340, an encapsulation layer 400, a light blocking layer 500, and the first to the third color filters 610 to 630.

The first substrate 100 may include glass or plastic. However, the first substrate 100 is not limited thereto and may be, for example, formed of a semiconductor material, such as a silicon wafer. A plurality of subpixels, for example, the first to the fourth subpixels P1 to P4, may be provided on the first substrate 100.

The display apparatus according to the first example embodiment of the present disclosure may be implemented as a top emission type where emitted light is irradiated upward. Accordingly, in this example implementation, an opaque material or a transparent material may be used as a material for the first substrate 100. However, the present disclosure is not limited thereto.

The circuit element layer 200 may be provided on the first substrate 100. Circuit elements (not illustrated) including various signal lines, thin film transistors (TFTs), a capacitor, and the like may be provided in the circuit element layer 200, in each of the subpixels P1 to P4. The signal lines (not illustrated) may include a gate line, a data line, a power line, and a reference line. The TFTs (not illustrated) may include a switching TFT, a driving TFT, and a sensing TFT.

The switching TFT may be turned on based on a gate signal supplied through the gate line and may transfer a data voltage, supplied through the data line, to the driving TFT.

The driving TFT may be turned on with the data voltage supplied through the switching TFT and may generate a data current from the power supplied through the power line to supply the data current to the first electrode 310.

The sensing TFT may sense a threshold voltage deviation of the driving TFT which may cause a degradation in image quality. The sensing TFT may supply a current of the driving TFT to the reference line in response to a sensing control signal supplied through the gate line or a separate sensing line.

The capacitor may hold the data voltage supplied to the driving TFT during one frame and may be connected to each of a gate terminal and a source terminal of the driving TFT.

The first electrode 310 may be provided on the circuit element layer 200. The first electrode 310 may be patterned in each of the subpixels P1 to P4 and may function as an anode of the display apparatus. The first electrode 310 may be electrically connected to the driving TFT included in the circuit element layer 200.

The bank 340 may be formed in a matrix structure on the first electrode 310 at boundary regions between the plurality of subpixels P1 to P4 and may define an emission area in each of the plurality of subpixels P1 to P4. That is, in each of the plurality of subpixels P1 to P4, an opening region where the bank 340 is not formed may be an emission area.

The bank 340 may be formed of an organic layer, such as acryl resin, epoxy resin, phenolic resin, polyamide resin, or polyimide resin. Alternatively, the bank 340 may be formed of an inorganic layer, such as silicon nitride, aluminum nitride, zirconium nitride, titanium nitride, hafnium nitride, tantalum nitride, silicon oxide, aluminum oxide, or titanium oxide. Alternatively, the bank 340 may include a black material for absorbing light incident from the outside.

The light emitting layer 320 may be formed on the first electrode 310. The light emitting layer 320 may also be formed on the bank 340. That is, the light emitting layer 320 may be provided in each of the subpixels P1 to P4 and boundary regions therebetween.

The light emitting layer 320 may include a hole transporting layer, an organic light emitting layer, and an electron transporting layer. In this case, when a voltage is applied to the first electrode 310 and the second electrode 330, a hole and an electron move to the organic light emitting layer through the hole transporting layer and the electron transporting layer and are combined with each other in the organic light emitting layer of the light emitting layer 320 to emit light.

The light emitting layer 320 may be provided to emit white (W) light. To this end, the light emitting layer 320 may include a plurality of stacks which emit lights of different colors. For example, the light emitting layer 320 may include a first stack, a second stack, and a charge generating layer provided between the first stack and the second stack. The first stack may include a first hole transporting layer, a first organic light emitting layer having blue or yellowish green, and a first electron transporting layer, but is not limited thereto. The charge generating layer may include an N-type charge generating layer to provide an electron to the first stack and a P-type charge generating layer provide a hole to the second stack. The second stack may include a second hole transporting layer, a second organic light emitting layer having blue or yellowish green, and a second electron transporting layer, but is not limited thereto. Also, the light emitting layer 320 may be formed of the same material to have the same thickness in each of the subpixels P1 to P4.

The second electrode 330 may be formed on the light emitting layer 320. The second electrode 330 may function as a cathode of the display apparatus. Like the light emitting layer 320, the second electrode 330 may be formed in each of the subpixels P1 to P4 and also in boundary regions therebetween. That is, the second electrode 330 may be formed on the first electrode 310 and on the bank 340.

Because the display apparatus according to an example embodiment of the present disclosure is implemented as the top emission type, the second electrode 330 may include a transparent metal material, such as indium tin oxide (ITO) or indium zinc oxide (IZO), for upwardly transmitting light emitted from the light emitting layer 320.

The encapsulation layer 400 may be formed on the second electrode 330. The encapsulation layer may include a first encapsulation layer 410, a second encapsulation layer 420, and a third encapsulation layer 430.

The first encapsulation layer 410 may be formed to cover the second electrode 330 and may include an inorganic material, such as silicon nitride, aluminum nitride, zirconium nitride, titanium nitride, hafnium nitride, tantalum nitride, silicon oxide, aluminum oxide, or titanium oxide.

The second encapsulation layer 420 may be formed to cover the first encapsulation layer 410 and may include an organic material, such as acryl resin, epoxy resin, phenolic resin, polyamide resin, or polyimide resin.

Metal patterns 450 may be formed in the second encapsulation layer 420. The metal patterns 450 may be formed on a whole surface of the light emitting layer 320 at a certain interval therebetween. The metal patterns 450 may include a low-reflectivity metal material, such as aluminum (Al), titanium (Ti), silver (Ag), copper (Cu), plutonium (Pu), or platinum (Pt), for decreasing the reflectivity of external light. Also, the metal patterns 450 may further include metal, such as magnesium (Mg), titanium (Ti), vanadium (V), yttrium (Y), zirconium (Zr), niobium (Nb), or palladium (Pd), for collecting hydrogen flowing in from the outside.

The third encapsulation layer 430 may be formed to cover the second encapsulation layer 420 and may include an inorganic material, such as silicon nitride, aluminum nitride, zirconium nitride, titanium nitride, hafnium nitride, tantalum nitride, silicon oxide, aluminum oxide, or titanium oxide.

The light blocking layer 500 may be formed on the encapsulation layer 400. The light blocking layer 500 may be formed in a matrix structure at boundary regions between the plurality of subpixels P1 to P4 and may prevent light leakage from occurring in the boundary regions between the subpixels P1 to P4.

The color filters 610 to 630 may be formed on the light blocking layer 500 and the encapsulation layer 400. In FIG. 1, an example where the color filters 610 to 630 are formed on a top surface of the light blocking layer 500 is illustrated, but the present disclosure is not limited thereto. The light blocking layer 500 may be formed on a top surface of each of the color filters 610 to 630.

The color filters 610 to 630 may include a first color filter 610 of red (R) in the first subpixel P1, a second color filter 620 of green (G) in the second subpixel P2, and a third color filter 630 of blue (B) in the third subpixel P3. In the first subpixel P1, white (W) light emitted from the light emitting layer 320 may pass through the first color filter 610 of red, and thus, only red light may be transmitted. In the second subpixel P2, white (W) light emitted from the light emitting layer 320 may pass through the second color filter 620 of green, and thus, only green light may be transmitted. In the third subpixel P3, white (W) light emitted from the light emitting layer 320 may pass through the third color filter 630 of blue, and thus, only blue light may be transmitted. A color filter may not be provided in the fourth subpixel P4. Thus, in the fourth subpixel P4, white (W) light emitted from the light emitting layer 320 may be discharged as-is.

Although not shown, a protection film may be additionally provided on the color filters 610 to 630.

FIGS. 2A to 2G are cross-sectional views illustrating a process of forming the encapsulation layer 400 in the display apparatus according to the first example embodiment of the present disclosure.

Figure 2A:
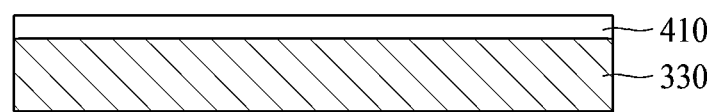
FIGS. 2A to 2G are cross-sectional views illustrating a process of forming an encapsulation layer in the display apparatus according to the first example embodiment of the present disclosure.

As shown in FIG. 2A, the first encapsulation layer 410 may be formed to cover the second electrode 330. The first encapsulation layer 410 may be formed by depositing an inorganic material, such as silicon nitride, aluminum nitride, zirconium nitride, titanium nitride, hafnium nitride, tantalum nitride, silicon oxide, aluminum oxide, or titanium oxide, on the second electrode 330.

Figure 2B:
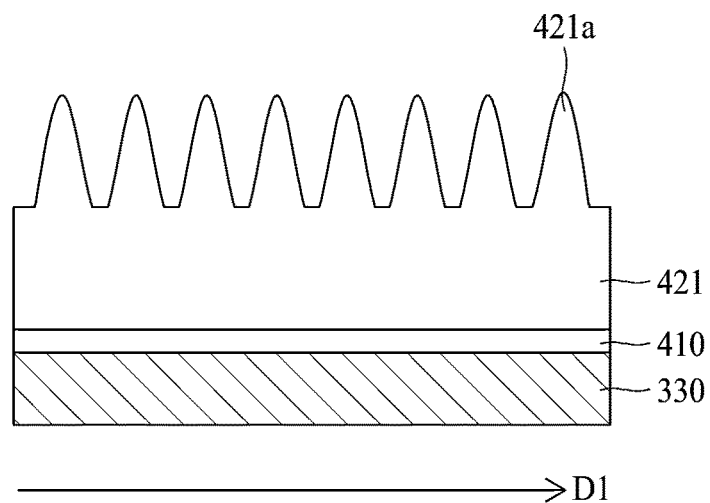
Figure 2C:
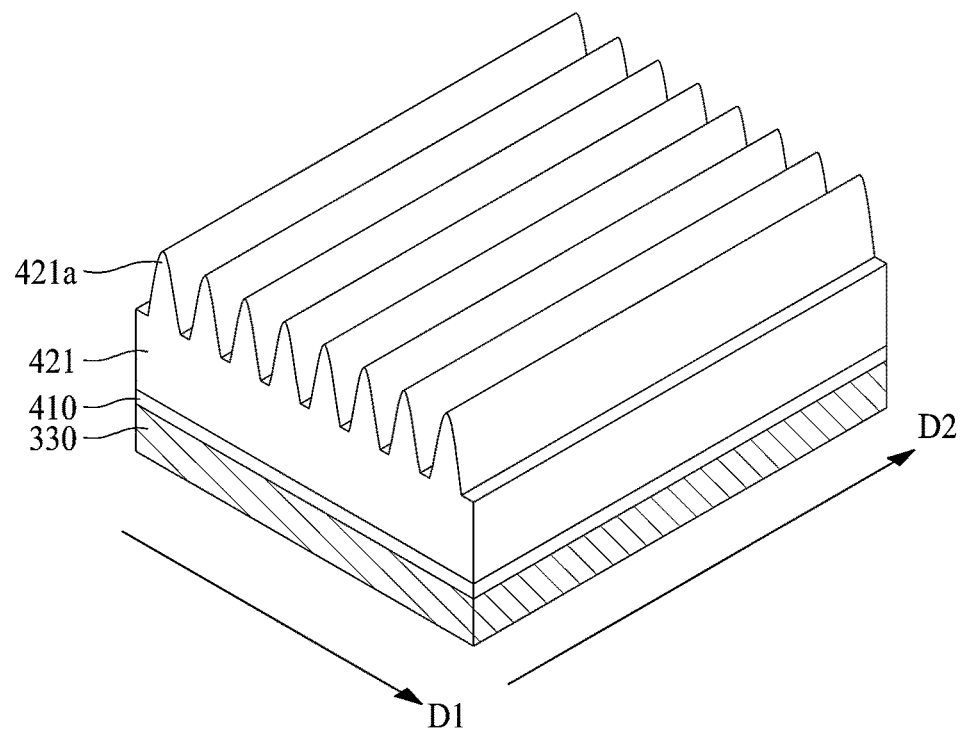

As illustrated in FIGS. 2B and 2C, a first organic layer 421 may be formed to cover the first encapsulation layer 410. The first organic layer 421 may include a plurality of protrusion portions 421a which are formed in a vertical direction on a plane having a certain thickness and to have the same height. The first organic layer 421 may be formed through a nano-imprint process. For example, an organic material may be thickly coated on the first encapsulation layer 410. Then, a mold having an inverse shape of the plurality of protrusion portions 421a may be pressed on the coated organic material. Also, light may be irradiated. Then, by removing the mold, the first organic layer 421 including the plurality of protrusion portions 421a may be formed. Also, the plurality of protrusion portions 421a may be arranged in one row at a certain interval in a first direction D1. Also, the plurality of protrusion portions 421a may have a rectilinear shape which extends in a second direction D2 perpendicular to the first direction D1. Example configurations of the plurality of protrusion portions 421a will be described below in detail with reference to FIGS. 3 and 4A to 4D.

Figure 2D:
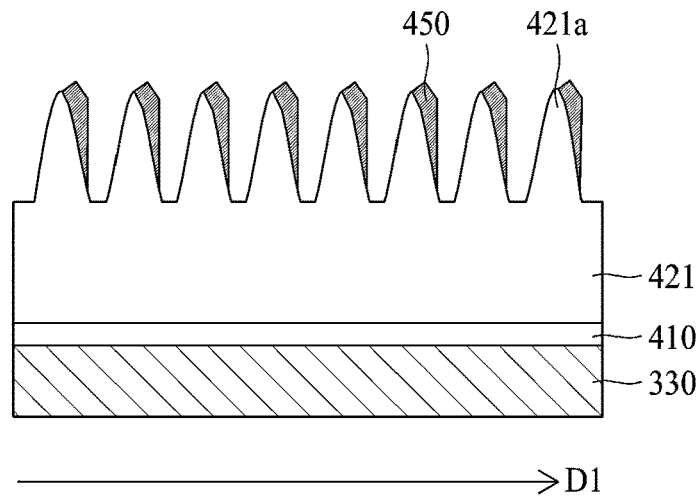
Figure 2E:
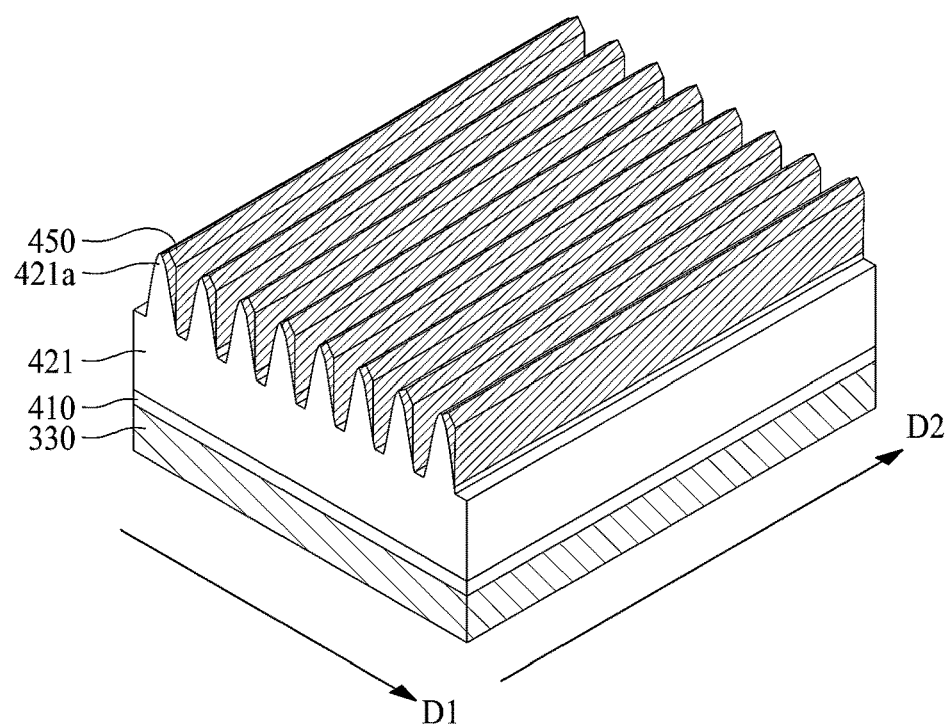

As illustrated in FIGS. 2D and 2E, the metal patterns 450 may be formed on the first organic layer 421. The metal patterns 450 may be formed by depositing a metal material having low reflectivity, such as aluminum (Al), titanium (Ti), silver (Ag), copper (Cu), plutonium (Pu), or platinum (Pt), on the first organic layer 421. Alternatively, the metal patterns 450 may be formed by depositing a metal material having a characteristic of collecting hydrogen, such as magnesium (Mg), titanium (Ti), vanadium (V), yttrium (Y), zirconium (Zr), niobium (Nb), or palladium (Pd), on the first organic layer 421.

A metal material may be deposited in a diagonal direction on the first organic layer 421. That is, a deposition angle between a top surface of the first encapsulation layer 410 and a path through which the metal material is deposited may be greater than 0 degrees and less than 90 degrees. FIGS. 2D and 2E illustrates an example where the metal material is deposited in a direction from an upper right end of the first organic layer 421 to a lower left end of the first organic layer 421. In this case, each of the plurality of protrusion portions 421a formed in a vertical direction may block a portion of the path through which the metal material is deposited. Thus, the metal material may be deposited on a right sidewall of each of the plurality of protrusion portions 421a. On the other hand, because a deposition path for the metal material may be a rectilinear direction, the metal material may not reach a left sidewall of each of the protrusion portions 421a. Thus, the metal material may not be deposited on a left sidewall of each of the protrusion portions 421a.

Also, the path through which the metal material is deposited may be blocked by the protrusion portion 421a at a lesser degree toward an upper end portion of the protrusion portion 421a than toward a lower end portion. Thus, the metal material may be deposited to be thicker toward the upper end portion of the protrusion portion 421a than toward the lower end portion.

Although not shown, in an example where the metal material is deposited in a diagonal direction from an upper left end of the first organic layer 421 toward a lower right end of the first organic layer 421, the metal material may be deposited on a left sidewall of each of the protrusion portions 421a. That is, the metal patterns 450 may be deposited on a left sidewall or a right sidewall of each of the plurality of protrusion portions 421a of the first organic layer 421, depending on the deposition direction. Thus, the metal patterns 450 may be formed apart from one another in the first direction D1 and may each be formed on a sidewall of the respective protrusion portion 421a.

Because the metal patterns 450 may be deposited on the left sidewall or the right sidewall of each of the plurality of protrusion portions 421a of the first organic layer 421, the metal patterns 450 may be formed without performing an additional photoresist process. Accordingly, because a polarization layer provided on the color filter 600 in the related art may be removed, a thickness of a display apparatus may be reduced, and the reflectivity of external light may be decreased based on a wire grid effect of the metal patterns 450.

Figure 2F:
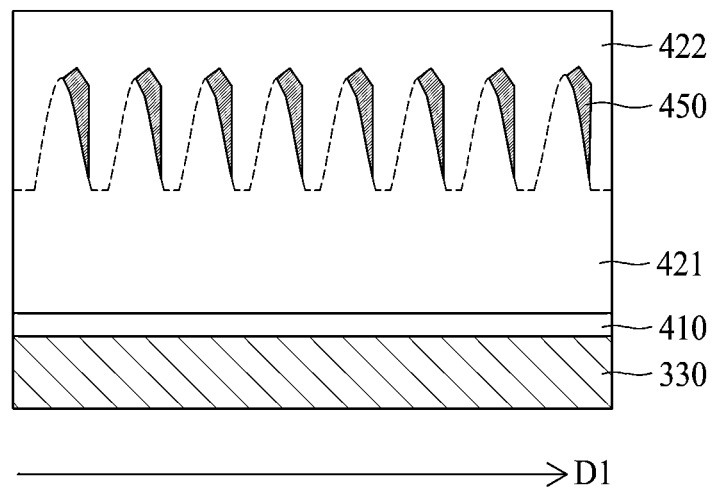

As shown in FIG. 2F, a second organic layer 422 may be formed to cover the first organic layer 421 and the metal patterns 450. The second organic layer 422 may be formed to include a flat top surface and may include the same material as the first organic layer 421. Therefore, a boundary region between the first organic layer 421 and the second organic layer 422 may not be differentiated. Thus, the first organic layer 421 and the second organic layer 422 may be seen as one layer. However, the present disclosure is not limited thereto, and the first organic layer 421 and the second organic layer 422 may include different materials. The first organic layer 421 and the second organic layer 422 may configure the second encapsulation layer 420. Thus, the metal patterns 450 may be provided within the second encapsulation layer 420.

Figure 2G:
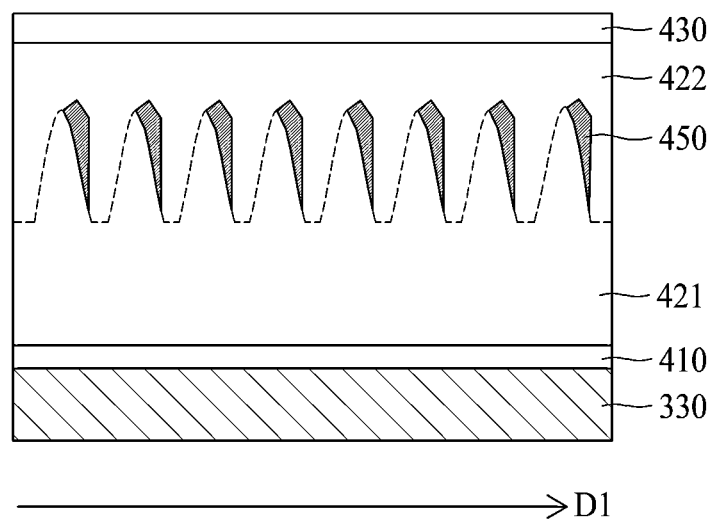

As illustrated in FIG. 2G, the third encapsulation layer 430 may be formed to cover the second organic layer 422. The third encapsulation layer 430 may be formed by flatly depositing an inorganic material, such as silicon nitride, aluminum nitride, zirconium nitride, titanium nitride, hafnium nitride, tantalum nitride, silicon oxide, aluminum oxide, or titanium oxide, on the second organic layer 422.

Figure 3:
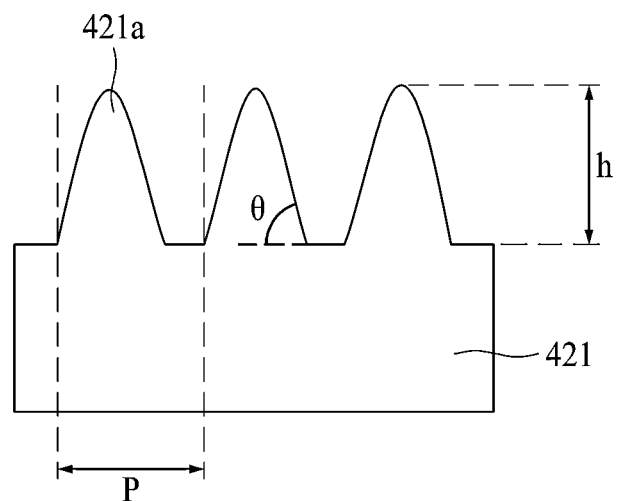
FIG. 3 is a cross-sectional view illustrating a plurality of protrusion portions of a first organic layer in the display apparatus according to the first example embodiment of the present disclosure.

FIG. 3 is a partial cross-sectional view illustrating the plurality of protrusion portions 421a of the first organic layer 421 in the display apparatus according to the first example embodiment of the present disclosure.

The plurality of protrusion portions 421a may be formed in an example shape where a width of the protrusion portions 421a gradually decreases from a lower portion thereof to an upper portion thereof. Also, two adjacent protrusion portions 421a may be formed apart from each other by a certain interval. For illustrative purposes, at an upper plane of the first organic layer 421, with a distance between the leftmost point of one protrusion portion 421a and the leftmost point of an adjacent protrusion portion 421a defined as an interval p between two adjacent protrusion portions 421a, the interval p between the two adjacent protrusion portions 421a may be set to about 400 nm or less. This results in the metal patterns 450 being formed at an interval of about 400 nm or less. For example, in the event that the interval p between the two adjacent protrusion portions 421a is greater than about 400 nm (i.e., an approximate low end of the wavelength range of visible light), a phenomenon where light incident from the outside is reflected may occur. Thus, the interval p between the two adjacent protrusion portions 421a may be set to a length shorter than the wavelength of visible light.

The plurality of protrusion portions 421a may have a shape which protrudes in a vertical direction from the plane of the first organic layer 421. For illustrative purposes, with a distance between the upper plane of the first organic layer 421 and an upper end of one protrusion portion 421a defined as a height h of the protrusion portion 421a, the height h of the protrusion portion 421a may be set to 50 nm or more and 200 nm or less. For example, in the event that the height h of the protrusion portion 421a is set to 50 nm or less, a polarization effect may be difficult to achieve. Also, in the event that the height h of the protrusion portion 421a is set to 200 nm or more, although the polarization effect may be expected, the protrusion portion 421a may not be formed in a vertical direction and may be bent. Thus, it may be difficult to uniformly form the protrusion portion 421a. Accordingly, the height h of the protrusion portion 421a may be set to 50 nm or more and 200 nm or less.

In one protrusion portion 421a, both sidewalls thereof may be formed to be symmetrical with respect to an upper end portion thereof. For illustrative purposes, an angle between the upper plane of the first organic layer 421 and one sidewall of one protrusion portion 421a is defined as an inclined angle (θ) of the protrusion portion 421a. As the inclined angle (θ) of the protrusion portions 421a increases, the polarization effect may increase, and the luminance of a display apparatus may be maintained. As the inclined angle (θ) of the protrusion portions 421a decreases, the metal patterns 450 may extend toward the upper plane of the first organic layer 421 along respective sidewalls of the protrusion portions 421a, and the polarization effect and luminance may be reduced. Accordingly, the inclined angle (θ) of the protrusion portions 421a may be set to be relatively large.

Moreover, the plurality of protrusion portions 421a may be formed in the same shape so that the metal patterns 450 may be formed in a uniform shape.

FIGS. 4A to 4D are cross-sectional views illustrating various example shapes of the metal patterns 450 and the protrusion portions 421a of the first organic layer 421 in the display apparatus according to the first example embodiment of the present disclosure. For illustrative purposes, FIGS. 4A to 4D depict one protrusion portion 421a and one metal pattern 450.

As illustrated in FIGS. 4A to 4D, the protrusion portion 421a of the first organic layer 421 may be formed in a tetragonal pillar, a trapezoid shape, a circular pillar, or a triangular shape, but are not limited thereto.

Figure 4A:
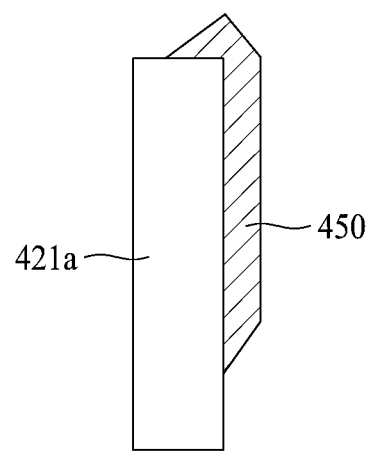
FIGS. 4A to 4D are cross-sectional views illustrating various example shapes of a metal pattern and a protrusion portion of a first organic layer in the display apparatus according to the first example embodiment of the present disclosure.
Figure 4B:
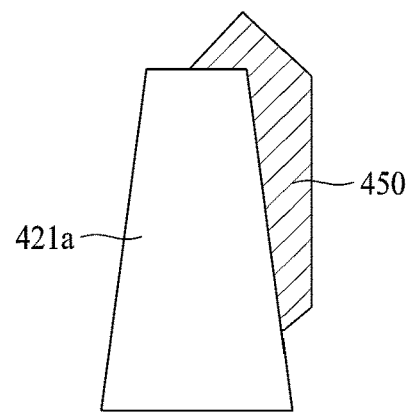

The metal pattern 450 may be formed along a sidewall of the protrusion portion 421a of the first organic layer 421 and may be formed to be thicker toward an upper end portion of the protrusion portion 421a of the first organic layer 421 than toward a lower end. Also, as illustrated in FIGS. 4A and 4B, in an example where a flat region is provided at the upper end portion of the protrusion portion 421a of the first organic layer 421, the metal pattern 450 may be formed to cover a partial region of the upper end portion of the protrusion portion 421a of the first organic layer 421.

Figure 4C:
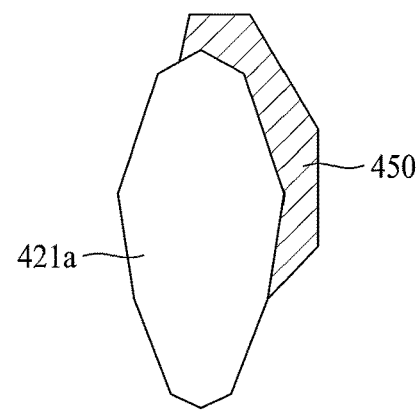
Figure 4D:
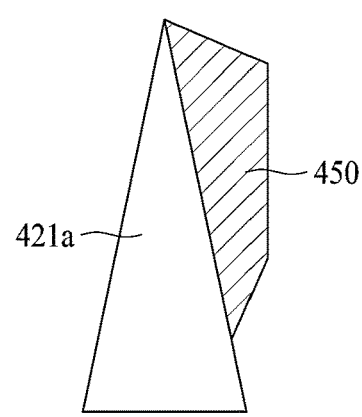

As illustrated in FIG. 4C, a sidewall of the protrusion portion 421a may have a convex shape where a plurality of planes, instead of one plane, may extend at a certain respective angle so that a plurality of corners may be provided. Also, in an example where the upper end portion of the protrusion portion 421a of the first organic layer 421 includes a vertex with an obtuse angle, the metal pattern 450 may be formed to extend from one sidewall of the protrusion portion 421a and cover a partial region of the other sidewall thereof. As illustrated in FIG. 4D, in an example where the upper end portion of the protrusion portion 421a of the first organic layer 421 includes a vertex with an acute angle, the metal pattern 450 may be formed on only one sidewall of the protrusion portion 421a.

Second Example Embodiment

Figure 5:
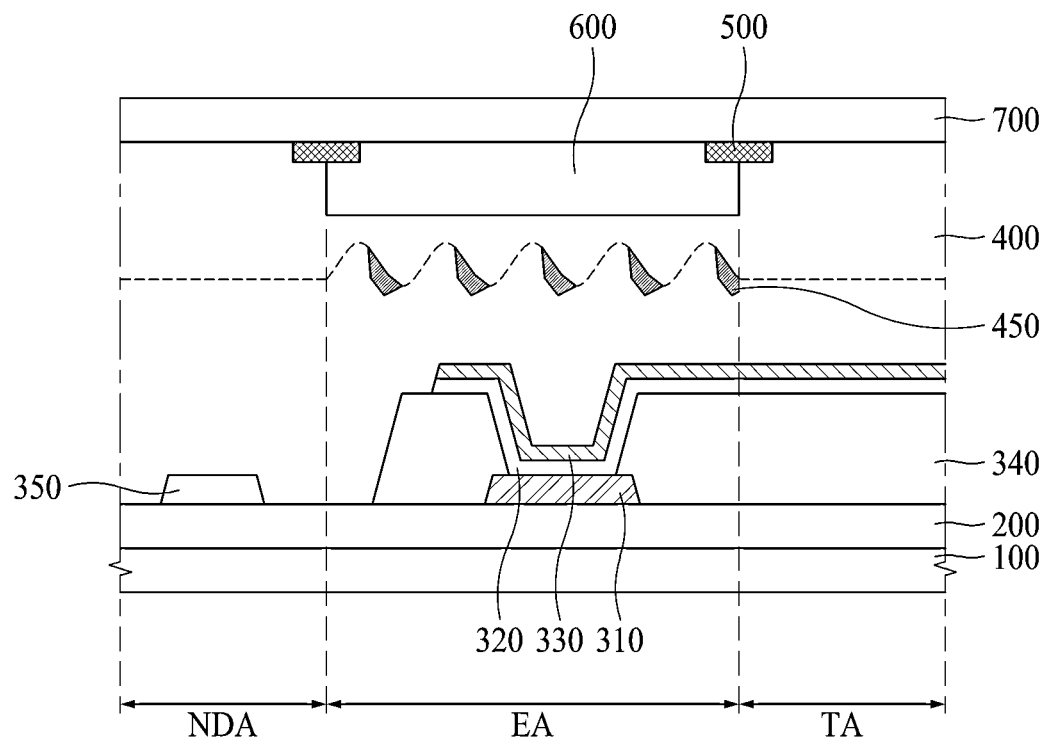
FIG. 5 is a schematic cross-sectional view of one pixel in a display apparatus according to a second example embodiment of the present disclosure.

FIG. 5 is a schematic cross-sectional view of one pixel in a display apparatus according to a second example embodiment of the present disclosure.

As shown in FIG. 5, the display apparatus according to the second example embodiment of the present disclosure may include a first substrate 100, a circuit element layer 200, a first electrode 310, a light emitting layer 320, a second electrode 330, a bank 340, an encapsulation layer 400, a color filter 600, and a second substrate 700.

The first substrate 100 may be divided into an emission area EA, a transmission area TA, and a non-display area NDA. The emission area EA may be an area which emits light by using a light emitting device (comprised of the first electrode 310, the light emitting layer 320, and the second electrode 330). The transmission area TA may be an area which is recognized to be transparent as light is transmitted. The non-display area NDA may be formed to surround the emission area EA and the transmission area TA. The first substrate 100 may include glass or plastic. However, the first substrate 100 is not limited thereto and may be, for example, formed of a semiconductor material, such as a silicon wafer. Also, because light should pass through the transmission area TA, the first substrate 100 may include a transparent material.

In FIG. 5, the circuit element layer 200, the first electrode 310, the light emitting layer 320, and the second electrode 330 provided in the emission area EA may be the same as the circuit element layer 200, the first electrode 310, the light emitting layer 320, and the second electrode 330 illustrated in FIG. 1, respectively. Thus, their detailed descriptions are omitted.

The bank 340 may extend from the emission area EA to the transmission area TA.

A pad part 350 may be provided in the non-display area NDA. A plurality of electrodes connected to the circuit element layer 200 may be provided in the pad part 350.

The encapsulation layer 400 may be provided between the first substrate 100 and the second substrate 700. The encapsulation layer 400 may be provided to cover all of the light emitting device provided in the emission area EA and the bank 340 provided in the transmission area TA. The encapsulation layer 400 may be formed in the non-display area NDA but may not cover the pad part 350. The encapsulation layer 400 may be formed of an organic material, such as acryl resin, epoxy resin, phenolic resin, polyamide resin, or polyimide resin.

A metal patterns 450 may be formed in the encapsulation layer 400. The metal patterns 450 may be provided over a whole surface of the first substrate 100 in the emission area EA at a certain interval therebetween. The metal patterns 450 may include a low-reflectivity metal material, such as aluminum (Al), titanium (Ti), silver (Ag), copper (Cu), plutonium (Pu), or platinum (Pt), for decreasing the reflectivity of external light. Also, the metal patterns 450 may further include metal, such as magnesium (Mg), titanium (Ti), vanadium (V), yttrium (Y), zirconium (Zr), niobium (Nb), or palladium (Pd), for collecting hydrogen flowing in from the outside.

The second substrate 700 may be formed on the encapsulation layer 400. The second substrate 700 may include glass or plastic. However, the second substrate 700 is not limited thereto and may be, for example, formed of a semiconductor material, such as a silicon wafer. Also, because light should pass through the transmission area TA, the second substrate 700 may include a transparent material.

The light blocking layer 500 may be formed under the second substrate 700. The light blocking layer 500 may be formed in a matrix structure in a boundary region between the emission area EA and the non-display area NDA and in a boundary region between the emission area EA and the transmission area TA, thereby preventing light leakage from occurring in each of the boundary regions.

The color filter 600 may be provided under the light blocking layer 500 and the second substrate 700 in the emission area EA. FIG. 5 illustrates an example where the color filter 600 is provided on a bottom surface of the light blocking layer 500. However, the present disclosure is not limited thereto, and the light blocking layer 500 may be provided on a bottom surface of the color filter 600.

The color filter 600 may be one of a red (R) color filter, a green (G) color filter, and a blue (B) color filter.

FIGS. 6A to 6G are cross-sectional views illustrating a process of forming the encapsulation layer 400 in the display apparatus according to the second example embodiment of the present disclosure.

Figure 6A:
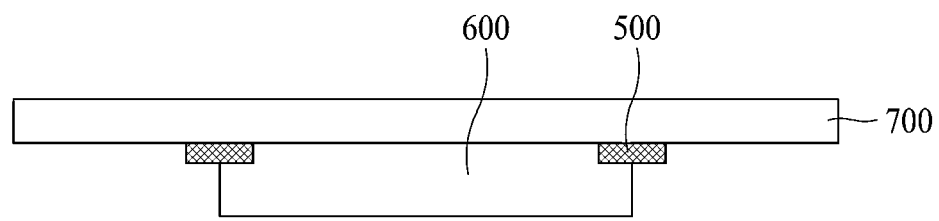
FIGS. 6A to 6G are cross-sectional views illustrating a process of forming an encapsulation layer in the display apparatus according to the second example embodiment of the present disclosure.

As shown in FIG. 6A, the light blocking layer 500 and the color filter 600 may be formed under the second substrate 700 in a region corresponding to the emission area EA.

Figure 6B:
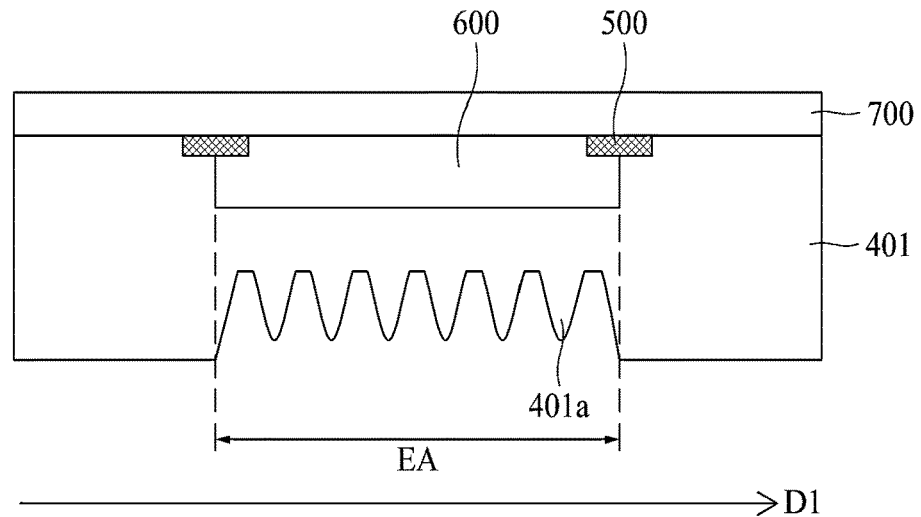
Figure 6C:
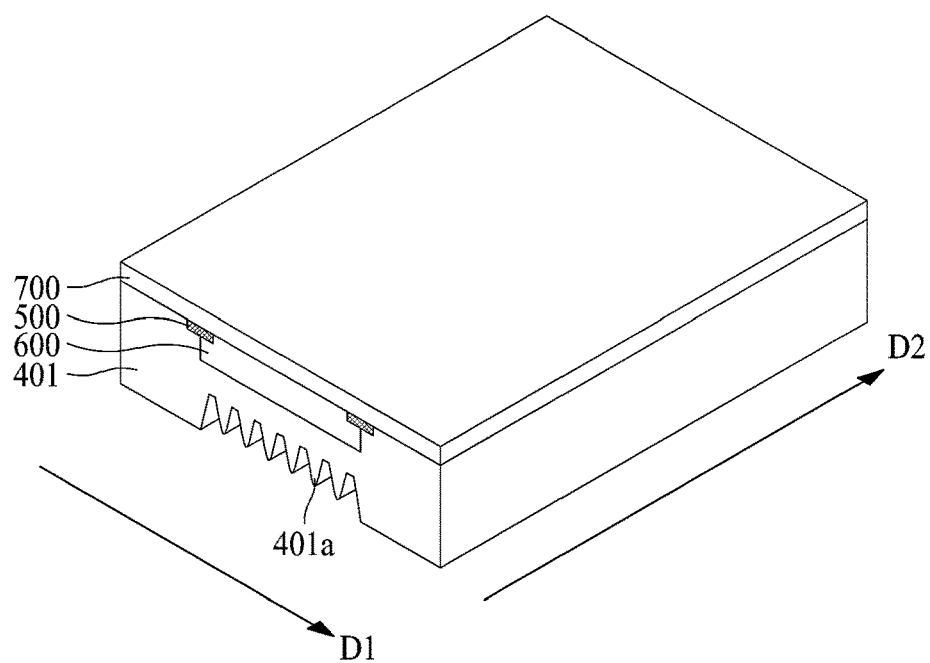

As illustrated in FIGS. 6B and 6C, a first organic layer 401 may be formed to cover the light blocking layer 500 and the color filter 600. In a region overlapping the color filter 600, the first organic layer 401 may include a plurality of protrusion portions 401a which are formed in a vertical direction on a plane having a certain thickness and have the same height. Also, in regions not overlapping the color filter 600, the first organic layer 401 may be formed to be flat and may be provided to be thicker than a height of the plurality of protrusion portions 401a. The first organic layer 401 may be formed through a nano-imprint process. For example, an organic material may be thickly coated on the second substrate 700. Then, a mold having an inverse shape of the plurality of protrusion portions 401a may be pressed on the coated organic material. Also, light may be irradiated. Then, by removing the mold, the first organic layer 401 including the plurality of protrusion portions 401a may be formed. Also, the plurality of protrusion portions 401a may be arranged in one row at a certain interval in a first direction D1. The plurality of protrusion portions 401a may have a rectilinear shape which extends in a second direction D2 perpendicular to the first direction D1.

Figure 6D:
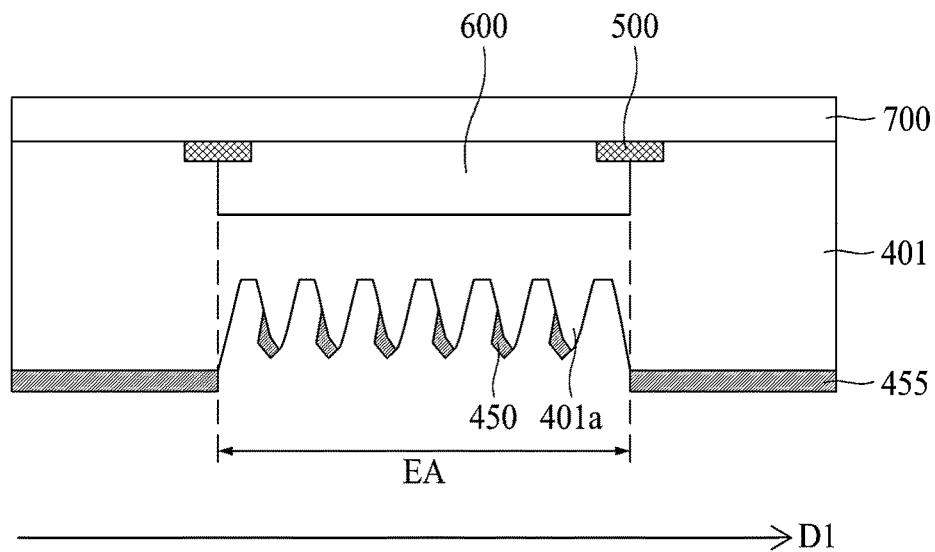
Figure 6E:
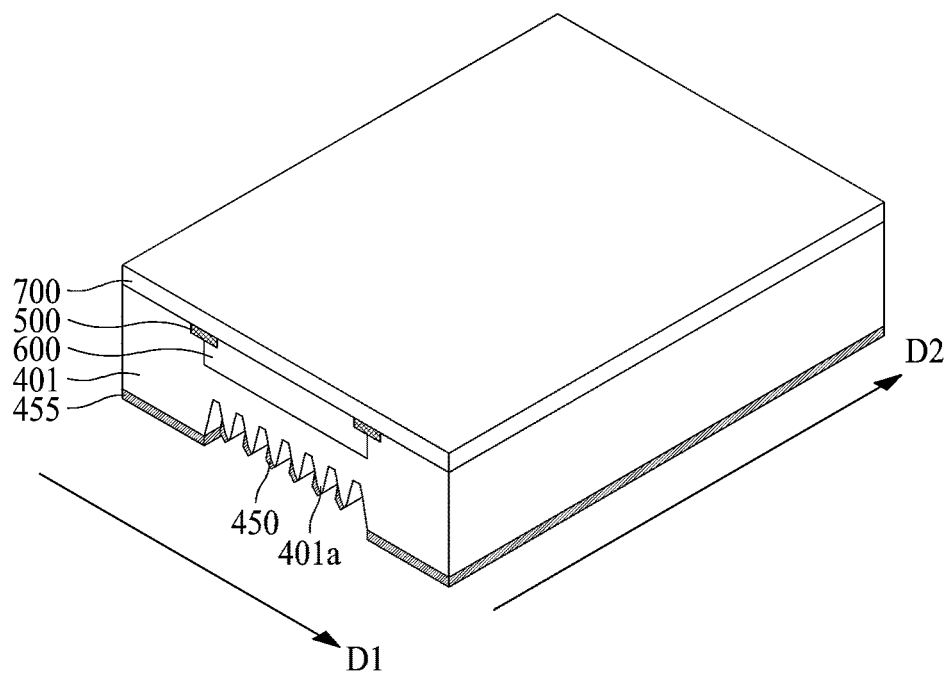

As illustrated in FIGS. 6D and 6E, the metal patterns 450 and a metal layer 455 may be formed on the first organic layer 401. The metal patterns 450 and the metal layer 455 may be formed by depositing a metal material having low reflectivity, such as aluminum (Al), titanium (Ti), silver (Ag), copper (Cu), plutonium (Pu), or platinum (Pt), on the encapsulation layer 400. Also, the metal patterns 450 and the metal layer 455 may further include a metal material having a characteristic of collecting hydrogen, such as magnesium (Mg), titanium (Ti), vanadium (V), yttrium (Y), zirconium (Zr), niobium (Nb), or palladium (Pd).

A metal material may be deposited in a diagonal direction on the first organic layer 401. That is, a deposition angle between a lower surface of the second substrate 700 and a path through which the metal material is deposited may be greater than 0 degrees and less than 90 degrees. FIG. 6C illustrates an example where the metal material is deposited in a direction from a lower left end of the first organic layer 401 to an upper right end of the first organic layer 401. In this case, each of the plurality of protrusion portions 401a provided in the emission area EA in a vertical direction may block a portion of the path through which the metal material is deposited. Thus, the metal material may be deposited on a left sidewall of each of the plurality of protrusion portions 401a. On the other hand, a deposition path for the metal material may be a rectilinear direction. Thus, the metal material may not reach a right sidewall of each of the protrusion portions 401a, whereby the metal material may not be deposited thereon.

Also, the path through which the metal material is deposited may be blocked by the protrusion portions 401a at a greater degree toward the upper end portion of the protrusion portions 401a than toward the lower end portion. Thus, the metal material may be deposited to be thicker toward the lower end portion of the protrusion portions 401a than toward the upper end portion.

Also, in examples where the lower end portion of the protrusion portions 401a is flat, the metal material may be deposited on the lower end portion of the protrusion portions 401a. Although not shown, in examples where the metal material is deposited in a diagonal direction from a lower right end of the first organic layer 401, the metal material may be deposited on a right sidewall of each of the protrusion portions 401a, instead of the left sidewall. That is, the metal patterns 450 may be deposited on a left sidewall or a right sidewall of each of the plurality of protrusion portions 401a of the first organic layer 401, depending on the deposition direction. Thus, the metal patterns 450 may be formed apart from one another in the first direction D1 and may each be formed on a sidewall of the respective protrusion portion 401a.

In the non-display area NDA and the transmission area TA, a bottom surface of the first organic layer 401 may be formed to be flat. Thus, although the metal material is deposited in a diagonal direction, the metal layer 455 may be formed flat on the first organic layer 401.

Figure 6F:
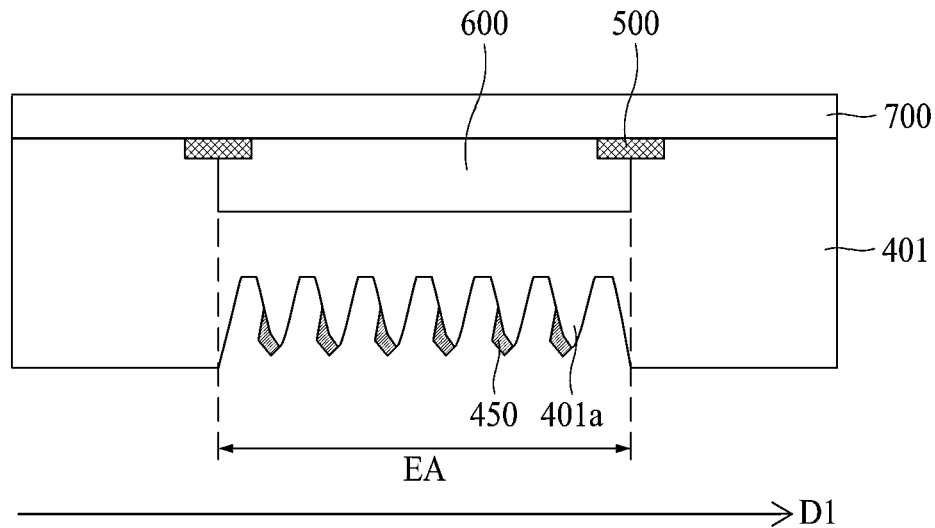

As illustrated in FIG. 6F, the metal layer 455 provided in the non-display area NDA and the transmission area TA may be removed, and the metal patterns 450 provided in the emission area EA may not be removed.

Because the metal material is deposited on the left sidewall or the right sidewall of each of the plurality of protrusion portions 401a of the first organic layer 401, the metal patterns 450 may be formed without performing an additional photoresist process. Accordingly, because a polarization layer provided on the color filter 600 in the related art may be removed, a thickness of a display apparatus may be reduced, and the reflectivity of external light may be decreased based on a wire grid effect of the metal patterns 450. Also, because the metal patterns 450 are not provided in the transmission area TA, a transmittance of the transmission area TA may not be reduced.

Figure 6G:
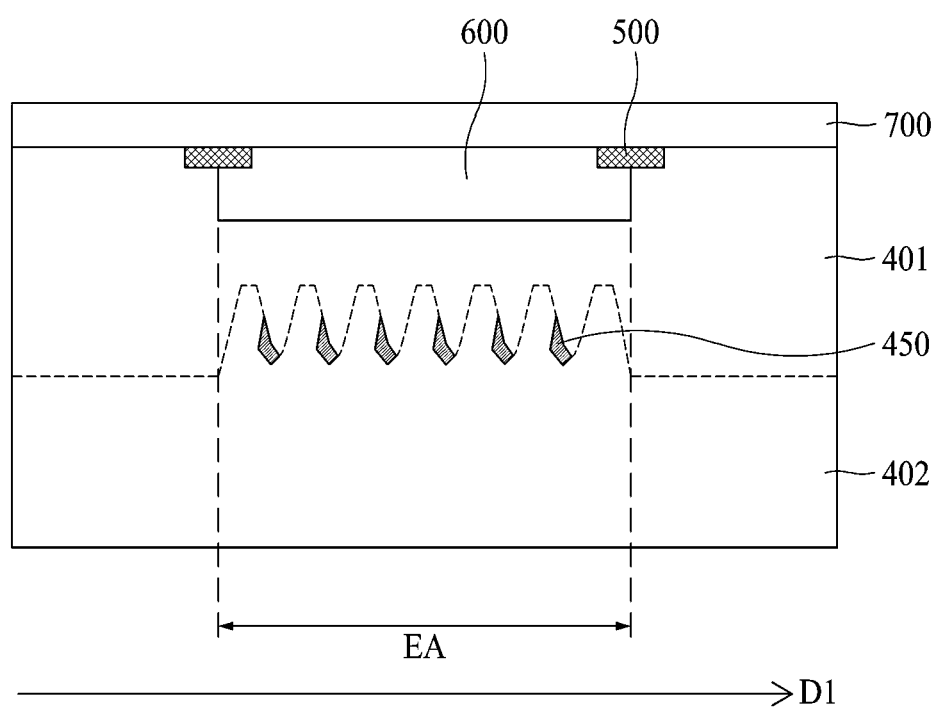

As illustrated in FIG. 6G, a second organic layer 402 may be formed to cover the first organic layer 401 and the metal patterns 450. The second organic layer 402 may be formed to include a flat bottom surface and may include the same material as the first organic layer 401. Therefore, a boundary region between the first organic layer 401 and the second organic layer 402 may not be differentiated. Thus, the first organic layer 401 and the second organic layer 402 may be seen as one layer. However, the present disclosure is not limited thereto, and the first organic layer 401 and the second organic layer 402 may include different materials. The first organic layer 401 and the second organic layer 402 may configure the encapsulation layer 400. Thus, the metal patterns 450 may be provided within the encapsulation layer 400.

Moreover, a display apparatus according to the second example embodiment of the present disclosure may be manufactured by bonding the second substrate 700, including the encapsulation layer 400, to the first substrate 100 including the light emitting device.

Moreover, various shapes described above with reference to FIGS. 3 and 4 may be applied to the plurality of protrusion portions 401a and the metal patterns 450 according to the second embodiment, but the present disclosure is not limited thereto.

According to the example embodiments of the present disclosure, because a plurality of metal patterns spaced apart from one another are provided on a light emitting device, a polarization layer may be omitted, and the reflectivity of external light may be reduced.

The above-described feature, structure, and effect of example embodiments of the present disclosure are included in at least one example embodiment of the present disclosure, but are not necessarily limited to only one example embodiment. Furthermore, the features, structures, and effects described with respect to at least one example embodiment of the present disclosure may be implemented through combination with or modification of other example embodiments by those skilled in the art. Therefore, such combinations and modifications should be construed as being within the scope of the present disclosure.

It will be apparent to those skilled in the art that various substitutions, modifications, and variations can be made in the present disclosure without departing from the spirit or scope of the present disclosure. Thus, it is intended that the present disclosure cover the various substitutions, modifications, and variations of this disclosure, provided they come within the scope of the appended claims and their equivalents.

What is claimed is:

1. A display apparatus, comprising:
   a first electrode on a substrate;
   a light emitting layer on the first electrode;
   a second electrode on the light emitting layer; and
   an encapsulation layer covering the second electrode, the encapsulation layer including a plurality of metal patterns spaced apart from one another,
   wherein the encapsulation layer further includes a first organic layer and a second organic layer overlapping each other,
   wherein the metal patterns are disposed between the first organic layer and the second organic layer to be disposed within the encapsulation layer,
   wherein the first organic layer includes a plurality of protrusion portions spaced apart from one another,
   wherein a second organic layer includes a flat surface facing away from the first organic layer, and
   wherein each of the metal patterns is provided on a sidewall of a corresponding one of the protrusion portions.

2. The display apparatus of claim 1, wherein the encapsulation layer comprises:
   a first encapsulation layer on the second electrode;
   a second encapsulation layer on the first encapsulation layer and including the first organic layer, the second organic layer, and the metal patterns; and
   a third encapsulation layer on the second encapsulation layer.

3. The display apparatus of claim 1, wherein the protrusion portions:
   protrude in a vertical direction on a plane of the first organic layer having a thickness,
   are arranged in one row at a predetermined interval in a first direction, and
   have a rectilinear shape extending in a second direction perpendicular to the first direction.

4. The display apparatus of claim 3, wherein the predetermined interval is less than or equal to 400 nm.

5. The display apparatus of claim 1, wherein the metal patterns are thicker toward upper end portions of the protrusion portions than toward lower end portions of the protrusion portions.

6. The display apparatus of claim 1, wherein a width of each of the protrusion portions decreases from a lower portion thereof to an upper portion thereof.

7. The display apparatus of claim 1, wherein:
an upper end portion of each of the protrusion portions includes a flat region, and
each of the metal patterns partially covers the upper end portion of the corresponding one of the protrusion portions.

8. The display apparatus of claim 1, wherein the sidewall of each of the protrusion portions is flat.

9. The display apparatus of claim 1, wherein each of the metal patterns covers a portion of a left sidewall and a portion of a right sidewall of the corresponding one of the protrusion portions based on a reference line passing through a center of the corresponding one of the protrusion portions in a vertical direction.

10. The display apparatus of claim 1, wherein a height of each of the protrusion portions is greater than or equal to 50 nm and less than or equal to 200 nm.

11. The display apparatus of claim 1, wherein the metal patterns are arranged at an interval of 400 nm or smaller.

12. The display apparatus of claim 1, wherein:
the substrate includes an emission area, a transmission area, and a non-display area;
the first electrode is provided in the emission area;
the light emitting layer and the second electrode are provided in the emission area and the transmission area; and
the encapsulation layer covers the second electrode in the emission area and the transmission area and includes the plurality of metal patterns in the emission area.

13. A display apparatus, comprising:
a substrate including an emission area, a transmission area, and a non-display area;
a first electrode on the substrate in the emission area;
a light emitting layer on the first electrode;
a second electrode on the light emitting layer; and
an encapsulation layer covering the second electrode in the emission area and the transmission area, the encapsulation layer including a plurality of metal patterns spaced apart from one another in the emission area,
wherein the encapsulation layer further includes a first organic layer, and a second organic layer between the first organic layer and the second electrode,
wherein the metal patterns are disposed between the first organic layer and the second organic layer to be disposed within the encapsulation layer,
wherein the first organic layer comprises a plurality of protrusion portions in the emission area and a flat bottom surface in the transmission area,
wherein the protrusion portions are spaced apart from one another, and
wherein each of the metal patterns is on a sidewall of a corresponding one of the protrusion portions.

14. The display apparatus of claim 13, wherein the protrusion portions:
protrude in a vertical direction on a plane of the first organic layer having a thickness,
are arranged in one row at a predetermined interval in a first direction, and
have a rectilinear shape extending in a second direction perpendicular to the first direction.

15. The display apparatus of claim 13, wherein:
the metal patterns are thicker toward lower end portions of the protrusion portions than toward upper end portions of the protrusion portions, and
a width of each of the protrusion portions decreases from an upper portion thereof to a lower portion thereof.

16. The display apparatus of claim 13, wherein:
a lower end portion of each of the protrusion portions includes a flat region, and
each of the metal patterns partially covers the lower end portion of the corresponding one of the protrusion portions.

* * * * *